(12) United States Patent
Vanous et al.

(10) Patent No.: US 11,648,821 B2
(45) Date of Patent: May 16, 2023

(54) METHODS AND SYSTEMS OF MINIMIZING C-RATE FLUCTUATION BY ADJUSTING OPERATION OF A TRANSPORT CLIMATE CONTROL SYSTEM

(71) Applicant: THERMO KING LLC, Minneapolis, MN (US)

(72) Inventors: Michael James Vanous, Minneapolis, MN (US); Carolyn Lewelling, Minneapolis, MN (US); Christos Alkiviadis Polyzois, Bloomington, MN (US)

(73) Assignee: THERMO KING LLC, Minneapolis, MN (US)

( * ) Notice: Subject to any disclaimer, the term of this patent is extended or adjusted under 35 U.S.C. 154(b) by 687 days.

(21) Appl. No.: 16/678,654

(22) Filed: Nov. 8, 2019

(65) Prior Publication Data

US 2021/0138876 A1     May 13, 2021

(51) Int. Cl.
*B60H 1/32* (2006.01)
*B60H 1/00* (2006.01)
*G01R 31/382* (2019.01)

(52) U.S. Cl.
CPC ....... *B60H 1/3205* (2013.01); *B60H 1/00428* (2013.01); *G01R 31/382* (2019.01);
(Continued)

(58) Field of Classification Search
CPC ........ B60H 1/00428; B60H 2001/3272; B60H 2001/3282
See application file for complete search history.

(56) References Cited

U.S. PATENT DOCUMENTS 6,223,546 B1  5/2001  Chopko et al.
3,000,858 A1  8/2011  Tonegawa et al.
(Continued)

FOREIGN PATENT DOCUMENTS

EP     2679418    1/2014
EP     2031443    5/2016
(Continued)

OTHER PUBLICATIONS

Extended European Search Report, issued in the corresponding European patent application No. 20206326.9, dated Mar. 30, 2021, 8 pages.

*Primary Examiner* — Schyler S Sanks
(74) *Attorney, Agent, or Firm* — Hamre, Schumann, Mueller & Larson, P.C.

(57) ABSTRACT

A method of minimizing C-Rate fluctuations with an electrically powered accessory (EPA) is disclosed. The EPA is configured to be used with at least one of a vehicle, a trailer, and a transport container that has a first controller. The EPA has a second controller. The method includes determining, by the first controller, a first C-Rate of a Rechargeable Energy Storage System (RESS). Also, the method includes comparing the first C-Rate to a first predetermined threshold. The method also includes when the first C-Rate exceeds the first predetermined threshold, the first controller sending a first request to the second controller to adjust a load of the EPA. The method further includes the second controller determining a first operational mode of the EPA based on the first request. Also the method includes when the first operational mode of the EPA allows a load change, the second controller adjusting the load of the EPA.

20 Claims, 8 Drawing Sheets

(52) U.S. Cl.
CPC ............... *B60H 2001/3272* (2013.01); *B60H 2001/3282* (2013.01); *H02J 2310/58* (2020.01)

(56) References Cited

U.S. PATENT DOCUMENTS

| | | | |
|---|---|---|---|
| 9,024,579 | B2 | 5/2015 | Igata |
| 9,024,586 | B2 | 5/2015 | Vance et al. |
| 9,627,902 | B2 | 4/2017 | Kamishima |
| 10,107,536 | B2 | 10/2018 | Sent, Jr. et al. |
| 10,112,487 | B1 | 10/2018 | Lee et al. |
| 10,317,119 | B2 | 6/2019 | Zou |
| 10,369,896 | B2 | 8/2019 | Namudur et al. |
| 2003/0209022 | A1* | 11/2003 | Ieda ............ B60H 1/3207 62/323.3 |
| 2005/0001431 | A1 | 1/2005 | Sauer et al. |
| 2006/0053814 | A1 | 3/2006 | Naik et al. |
| 2007/0212598 | A1 | 9/2007 | Iida et al. |
| 2008/0116830 | A1 | 5/2008 | Gonzalez et al. |
| 2008/0224663 | A1* | 9/2008 | Mack ............ H02J 1/14 320/132 |
| 2009/0055330 | A1* | 2/2009 | Medasani ....... G01R 31/382 706/2 |
| 2010/0271172 | A1 | 10/2010 | Takikita |
| 2011/0213983 | A1 | 9/2011 | Staugaitis et al. |
| 2013/0052490 | A1* | 2/2013 | TenHouten ........ B60H 1/00278 429/50 |
| 2014/0049216 | A1 | 2/2014 | Nakagawa et al. |
| 2015/0298680 | A1 | 10/2015 | Matthews |
| 2017/0072813 | A1 | 3/2017 | Martin et al. |
| 2018/0065446 | A1 | 3/2018 | Hansson et al. |
| 2018/0273018 | A1 | 9/2018 | Follen et al. |
| 2019/0183438 | A1 | 6/2019 | Lee et al. |
| 2019/0184483 | A1 | 6/2019 | Lee et al. |
| 2019/0193523 | A1 | 6/2019 | Takeuchi et al. |
| 2019/0291665 | A1 | 9/2019 | Martin |

FOREIGN PATENT DOCUMENTS

| | | |
|---|---|---|
| JP | 6351301 | 7/2018 |
| WO | 2006132070 | 12/2006 |
| WO | 2010/002644 | 1/2010 |
| WO | 2010009502 | 1/2010 |
| WO | 2010094302 | 8/2010 |
| WO | 2010145971 | 12/2010 |
| WO | 2011/078109 | 6/2011 |
| WO | 2014/002244 | 1/2014 |

* cited by examiner

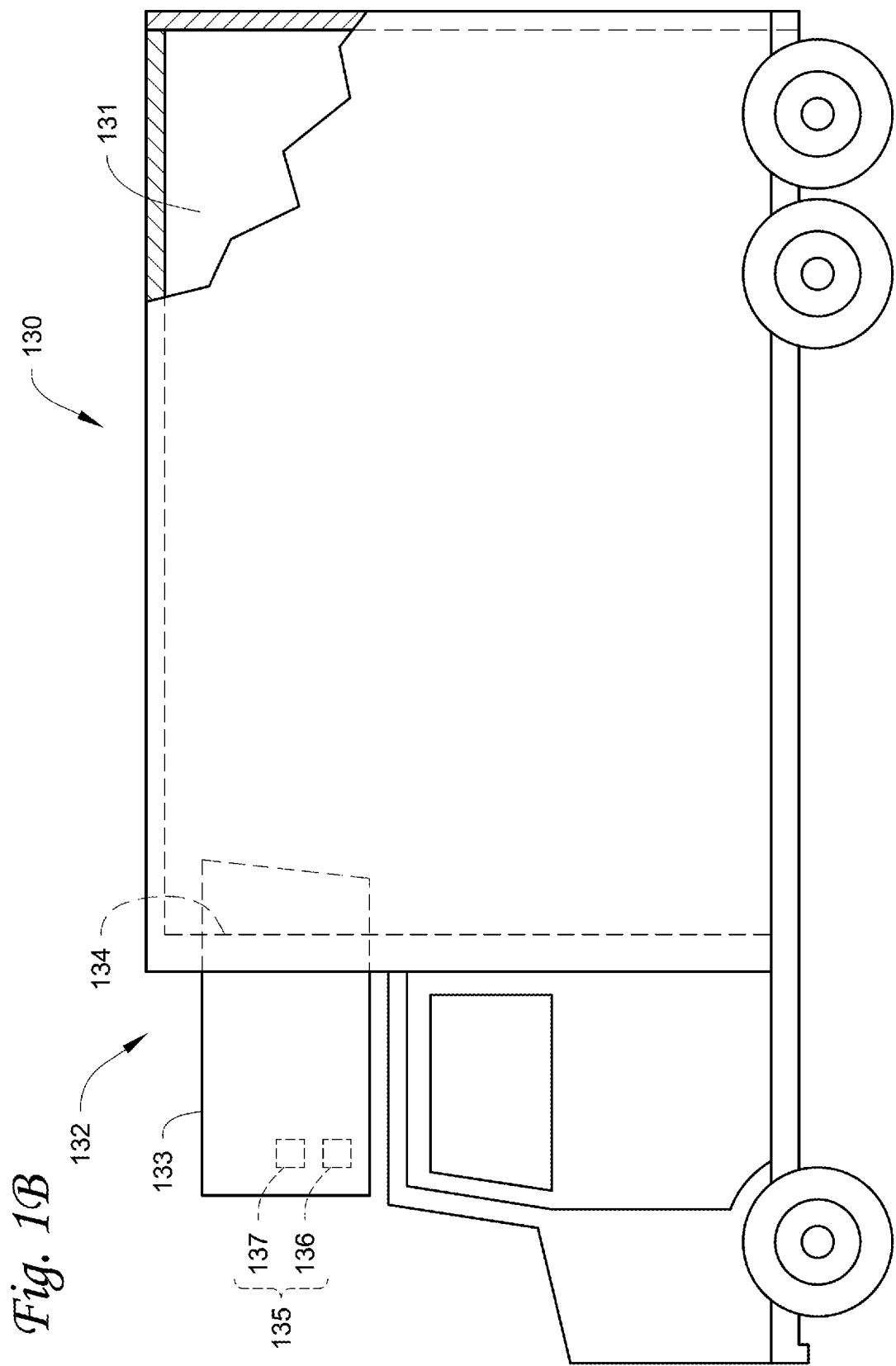

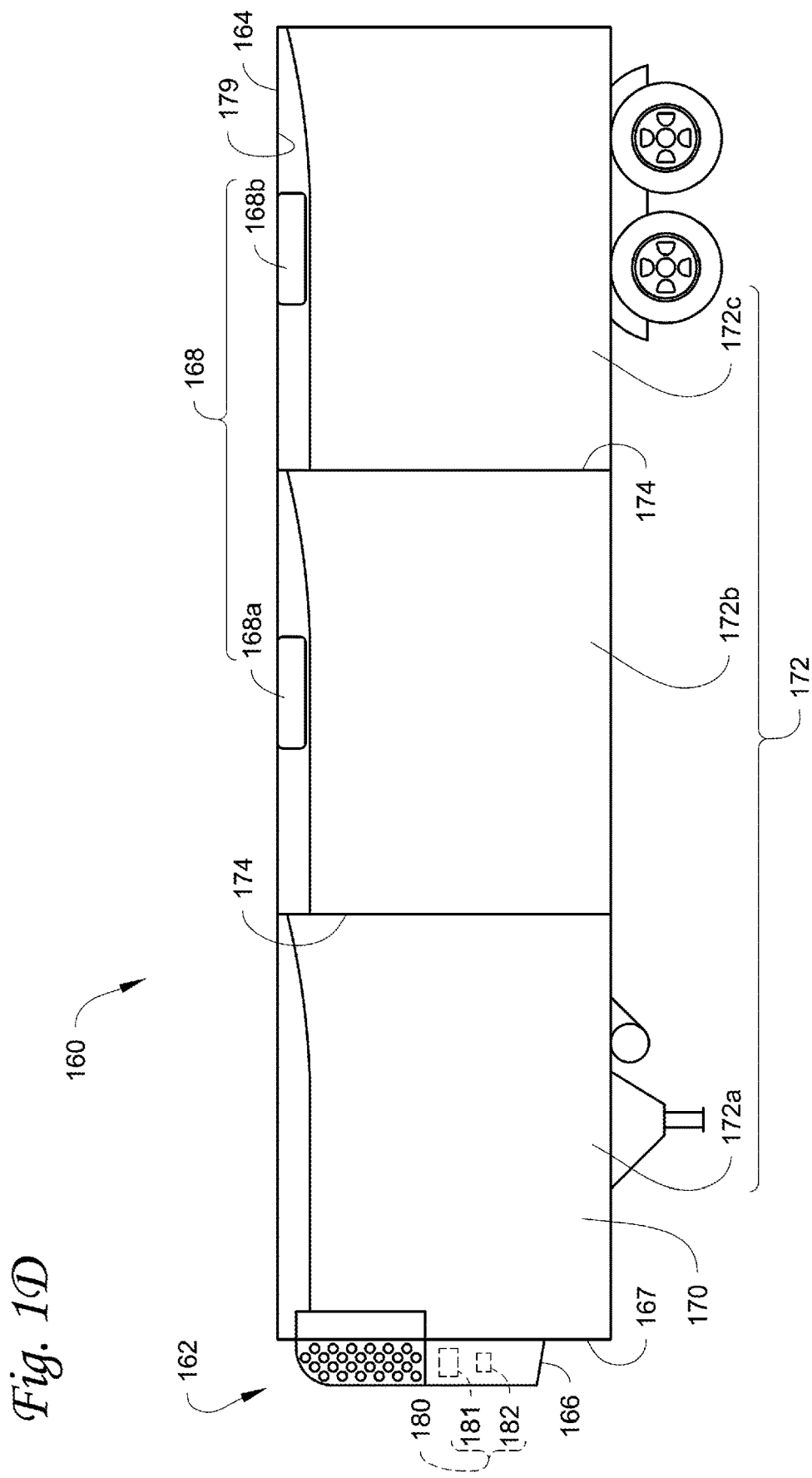

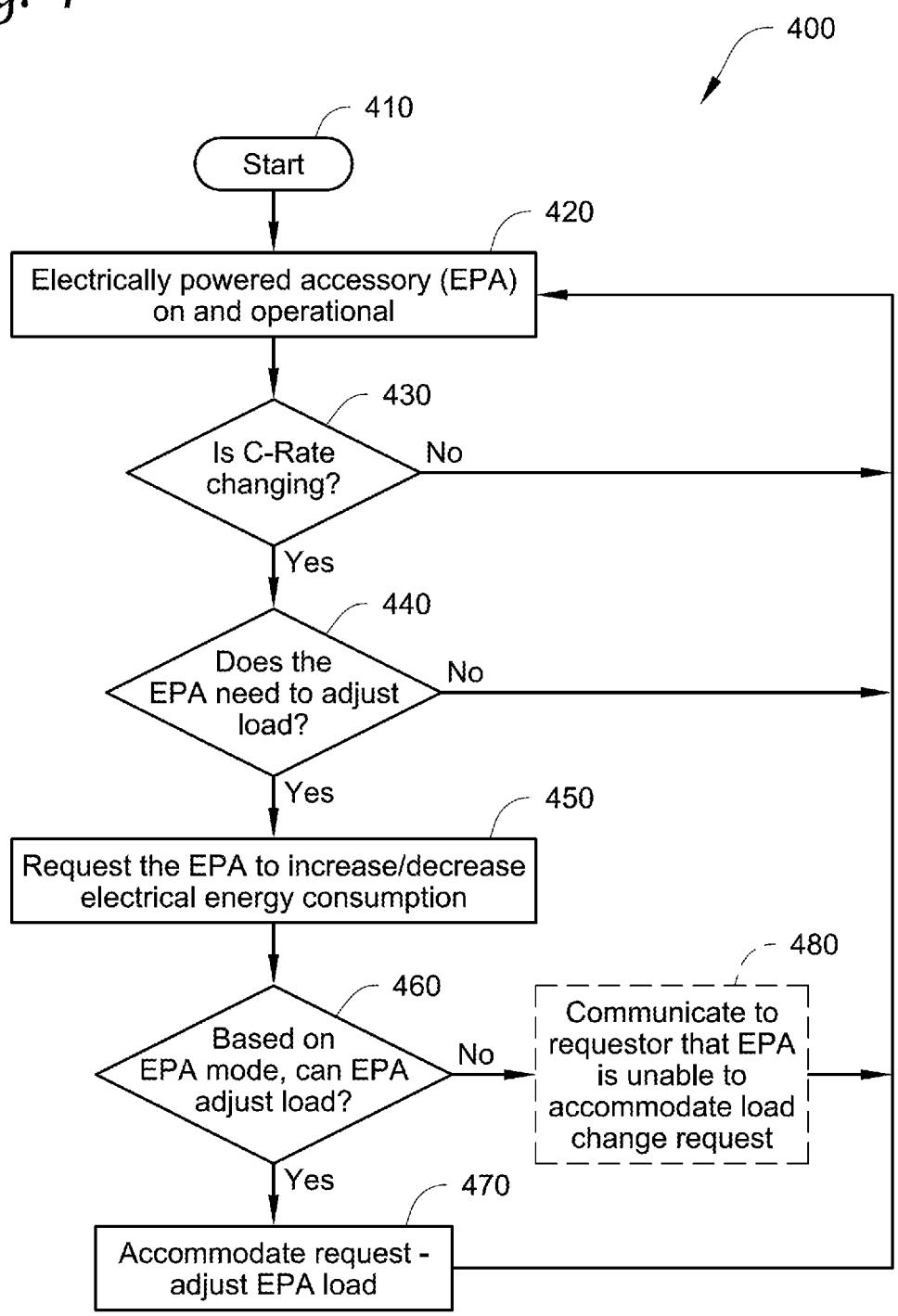

METHODS AND SYSTEMS OF MINIMIZING C-RATE FLUCTUATION BY ADJUSTING OPERATION OF A TRANSPORT CLIMATE CONTROL SYSTEM

FIELD

The disclosure herein relates to methods and systems of minimizing C-Rate fluctuations by adjusting operation of an electrically powered accessory configured to be used with at least one of a vehicle, trailer, and/or a transport container. More specifically, the disclosure relates to using the electrically powered accessory as a variable load, and increasing and/or decreasing power consumption of the electrically powered accessory to reduce the C-Rate fluctuations in a Rechargeable Energy Storage System (RESS).

BACKGROUND

A transport climate control system is generally used to control environmental condition(s) (e.g., temperature, humidity, air quality, and the like) within a climate controlled space of a transport unit (e.g., a truck, a container (such as a container on a flat car, an intermodal container, etc.), a box car, a semi-tractor, a bus, or other similar transport unit). The transport climate control system can include, for example, a transport refrigeration system (TRS) and/or a heating, ventilation and air conditioning (HVAC) system. The TRS can control environmental condition(s) within the climate controlled space to maintain cargo (e.g., produce, frozen foods, pharmaceuticals, etc.). The HVAC system can control environmental conditions(s) within the climate controlled space to provide passenger comfort for passengers travelling in the transport unit. In some transport units, the transport climate control system can be installed externally (e.g., on a rooftop of the transport unit, on a front wall of the transport unit, etc.).

SUMMARY

The disclosure herein relates to methods and systems of minimizing C-Rate fluctuations by adjusting operation of an electrically powered accessory configured to be used with at least one of a vehicle, trailer, and/or a transport container. More specifically, the disclosure relates to using the electrically powered accessory as a variable load, and increasing and/or decreasing power consumption of the electrically powered accessory to reduce the C-Rate fluctuations in the RESS.

In one embodiment, a method of minimizing C-Rate fluctuations by adjusting operation of a transport climate control system (TCCS) is disclosed. The method includes powering the TCCS using a Rechargeable Energy Storage System (RESS). The method also includes determining a first C-Rate of the RESS. Also, the method includes comparing the first C-Rate to a first predetermined threshold. The method also includes when the first C-Rate exceeds the first predetermined threshold, a controller of the TCCS determining a first operational mode of the TCCS. The method further includes the controller adjusting the load of the TCCS based on the first operational mode.

In one embodiment, a method of minimizing C-Rate fluctuations in a Rechargeable Energy Storage System (RESS) is disclosed. The method includes determining, by a controller of the vehicle, a first C-Rate of the RESS. Also, the method includes comparing the first C-Rate to a first predetermined threshold. The method also includes when the first C-Rate exceeds the first predetermined threshold, the controller sending a first request to an electrically powered accessory (EPA) to adjust a load of the EPA.

In one embodiment, a method of minimizing C-Rate fluctuations with an electrically powered accessory (EPA) is disclosed. The EPA is configured to be used with at least one of a vehicle, a trailer, and a transport container that has a first controller. The EPA has a second controller. The method includes powering the EPA using a Rechargeable Energy Storage System (RESS). The method also includes determining, by the first controller, a first C-Rate of the RESS. Also, the method includes comparing the first C-Rate to a first predetermined threshold. The method also includes when the first C-Rate exceeds the first predetermined threshold, the first controller sending a first request to the second controller to adjust a load of the EPA. The method further includes the second controller determining a first operational mode of the EPA based on the first request. Also the method includes the second controller adjusting the load of the EPA based on the first operational mode.

Embodiments disclosed herein can help in minimizing charge and/or discharge rate fluctuations in the RESS (e.g., battery), limiting detrimental effects on the life of the RESS, maximizing/increasing the life of the RESS, maximizing the use of available power, increasing the efficiency of the RESS, and optimizing the overall power usage. It will be appreciated that loads of the system can have power priority, where a threshold of the C-Rate (or C-Rate changes) can be set (e.g., implicitly) by a capacity of the power electronics hardware. It will also be appreciated that adjusting the C-Rate (or C-Rate changes) can include adjusting the apportionment of the C-Rate (or C-Rate changes) among the loads.

Embodiments disclosed herein can help determine how the EPA impacts the receiving power from its power source (e.g., RESS), determine/predict when the peaks and valleys of the RESS power usage occur, minimize the power rates going into or out of the RESS, use the EPA as a variable load to optimize available power (e.g., not to exceed the power limit anywhere else in the system) and provide opportunistic power consumption to satisfy desired operation goals (e.g., maintaining stable current going into or out of the RESS (e.g., prevent wear on the RESS), and/or minimize the current going into or out of the RESS at a particular moment).

BRIEF DESCRIPTION OF THE DRAWINGS

References are made to the accompanying drawings that form a part of this disclosure and which illustrate embodiments in which the systems and methods described in this specification can be practiced.

FIG. 1B illustrates a side view of a truck with a transport climate control system, according to one embodiment.

FIG. 1D illustrates a side view of a climate controlled transport unit with a multi-zone transport climate control system, according to one embodiment.

FIG. 4 is a flow chart illustrating a method for adjusting power consumption of an electrically powered accessory (EPA) to reduce the C-Rate fluctuations in a system, according to one embodiment.

Like reference numbers represent like parts throughout.

DETAILED DESCRIPTIONS

The disclosure herein relates to methods and systems of minimizing C-Rate fluctuations by adjusting operation of an electrically powered accessory configured to be used with at least one of a vehicle, trailer, and/or a transport container. More specifically, the disclosure relates to using the electrically powered accessory as a variable load, and increasing and/or decreasing power consumption of the electrically powered accessory to reduce the C-Rate fluctuations in the RESS.

As defined herein, a C-Rate of a Rechargeable Energy Storage System (RESS, e.g., battery) refers to the charge rate and/or discharge rate of the RESS. The C-Rate can be a measure of the rate at which the RESS is charged or discharged relative to its maximum capacity. The C-Rate can be the charge or discharge current divided by the rated charge of the RESS measured in Amp-hours. The unit of the C-Rate is "C". For example, for RESS with a capacity of 500 mAh, a discharge current of 5000 mA (i.e., 5 A) corresponds to a C-Rate of 10 C, meaning that such a current would discharge a fully charged RESS (e.g., a battery) in 0.1 hours or 6 minutes. Likewise, for the same RESS a charge current of 250 mA corresponds to a C-Rate of ½C, meaning that this current will increase the state of charge of this RESS by 50% (the percentage is the unit for state of charge) in one hour.

Figure 1A:
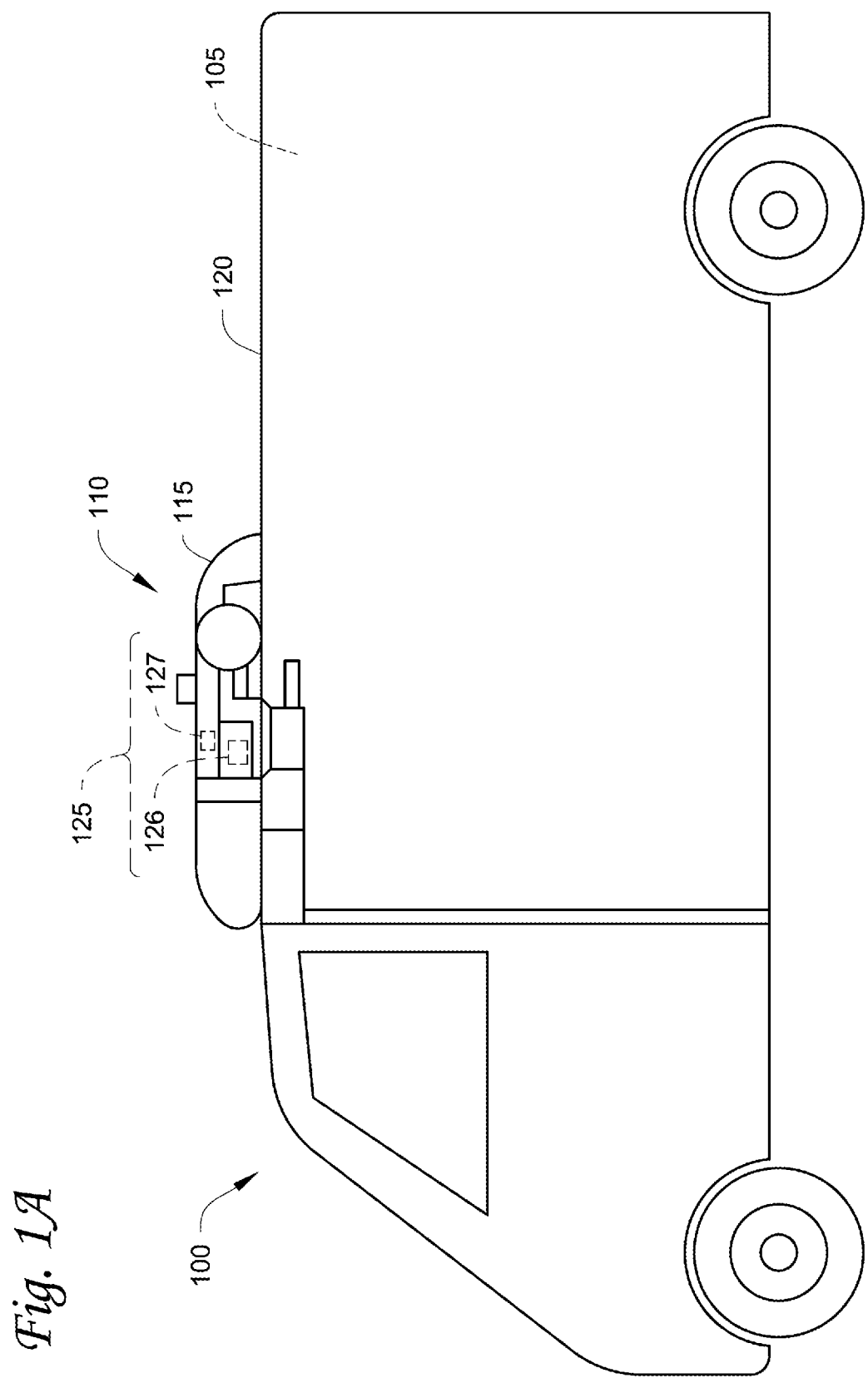
FIG. 1A illustrates a side view of a van with a transport climate control system, according to one embodiment.

FIG. 1A depicts a climate-controlled van 100 that includes a climate controlled space 105 for carrying cargo and a transport climate control system 110 for providing climate control within the climate controlled space 105. The transport climate control system 110 includes a climate control unit (CCU) 115 that is mounted to a rooftop 120 of the van 100. The transport climate control system 110 can include, amongst other components, a climate control circuit (see FIG. 2) that connects, for example, a compressor, a condenser, an evaporator and an expansion device to provide climate control within the climate controlled space 105. It will be appreciated that the embodiments described herein are not limited to climate-controlled vans, but can apply to any type of transport unit (e.g., a truck, a container (such as a container on a flat car, an intermodal container, a marine container, etc.), a box car, a semi-tractor, a bus, or other similar transport unit), etc.

The transport climate control system 110 also includes a programmable climate controller 125 and one or more sensors (not shown) that are configured to measure one or more parameters of the transport climate control system 110 (e.g., an ambient temperature outside of the van 100, an ambient humidity outside of the van 100, a compressor suction pressure, a compressor discharge pressure, a supply air temperature of air supplied by the CCU 115 into the climate controlled space 105, a return air temperature of air returned from the climate controlled space 105 back to the CCU 115, a humidity within the climate controlled space 105, etc.) and communicate parameter data to the climate controller 125. The climate controller 125 is configured to control operation of the transport climate control system 110 including the components of the climate control circuit. The climate controller 125 may comprise a single integrated control unit 126 or may comprise a distributed network of climate controller elements 126, 127. The number of distributed controller elements in a given network can depend upon the particular application of the principles described herein.

FIG. 1B depicts a climate-controlled straight truck 130 that includes a climate controlled space 131 for carrying cargo and a transport climate control system 132. The transport climate control system 132 includes a CCU 133 that is mounted to a front wall 134 of the climate controlled space 131. The CCU 133 can include, amongst other components, a climate control circuit (see FIG. 2) that connects, for example, a compressor, a condenser, an evaporator and an expansion device to provide climate control within the climate controlled space 131.

The transport climate control system 132 also includes a programmable climate controller 135 and one or more sensors (not shown) that are configured to measure one or more parameters of the transport climate control system 132 (e.g., an ambient temperature outside of the truck 130, an ambient humidity outside of the truck 130, a compressor suction pressure, a compressor discharge pressure, a supply air temperature of air supplied by the CCU 133 into the climate controlled space 131, a return air temperature of air returned from the climate controlled space 131 back to the CCU 133, a humidity within the climate controlled space 131, etc.) and communicate parameter data to the climate controller 135. The climate controller 135 is configured to control operation of the transport climate control system 132 including components of the climate control circuit. The climate controller 135 may comprise a single integrated control unit 136 or may comprise a distributed network of climate controller elements 136, 137. The number of distributed controller elements in a given network can depend upon the particular application of the principles described herein.

Figure 1C:
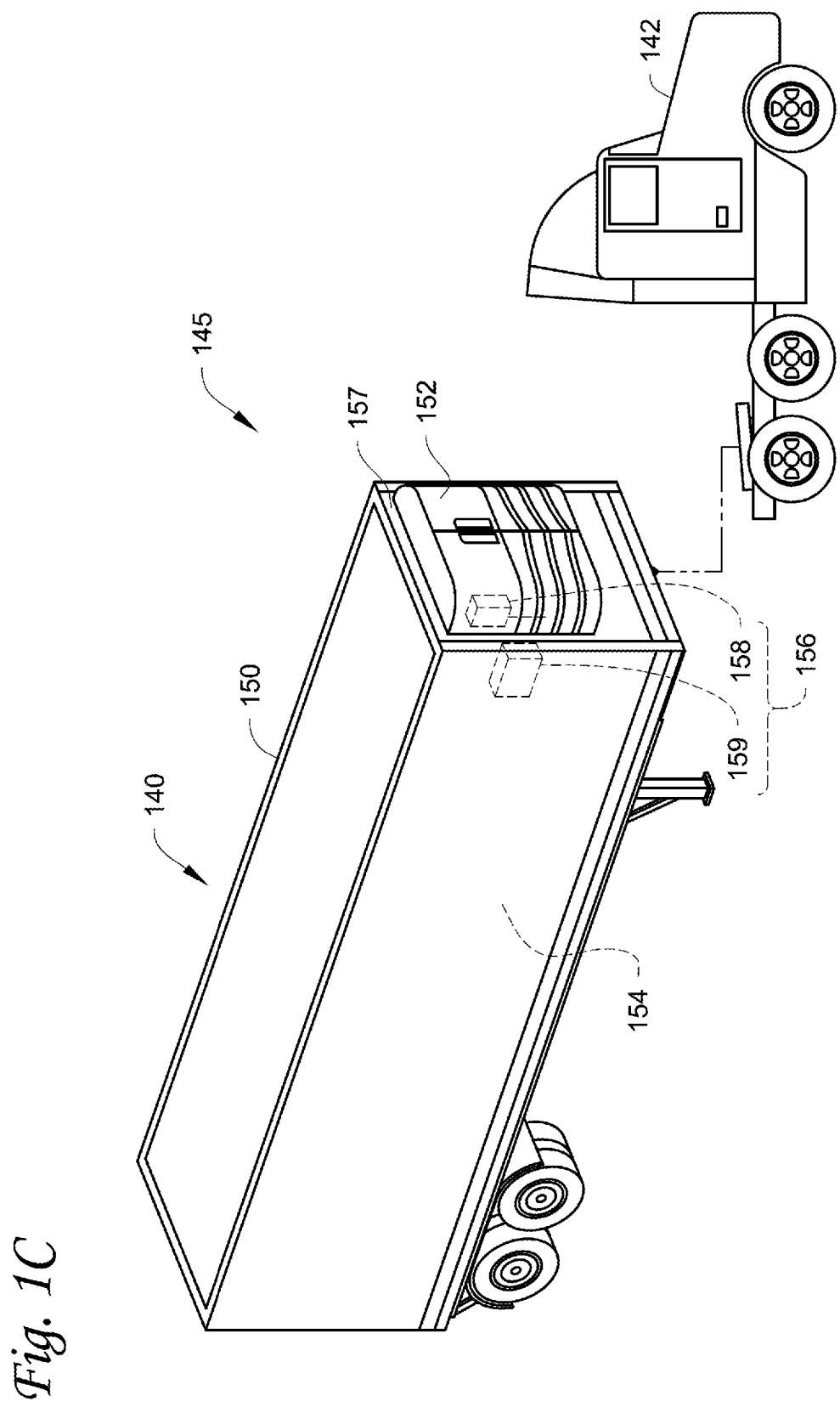
FIG. 1C illustrates a perspective view of a climate controlled transport unit, with a transport climate control system, attached to a tractor, according to one embodiment.

FIG. 1C illustrates one embodiment of a climate controlled transport unit 140 attached to a tractor 142. The climate controlled transport unit 140 includes a transport climate control system 145 for a transport unit 150. The tractor 142 is attached to and is configured to tow the transport unit 150. The transport unit 150 shown in FIG. 1C is a trailer.

The transport climate control system 145 includes a CCU 152 that provides environmental control (e.g. temperature, humidity, air quality, etc.) within a climate controlled space 154 of the transport unit 150. The CCU 152 is disposed on a front wall 157 of the transport unit 150. In other embodiments, it will be appreciated that the CCU 152 can be disposed, for example, on a rooftop or another wall of the transport unit 150. The CCU 152 includes a climate control circuit (see FIG. 2) that connects, for example, a compressor, a condenser, an evaporator and an expansion device to provide conditioned air within the climate controlled space 154.

The transport climate control system 145 also includes a programmable climate controller 156 and one or more sensors (not shown) that are configured to measure one or more parameters of the transport climate control system 145 (e.g., an ambient temperature outside of the transport unit 150, an ambient humidity outside of the transport unit 150, a compressor suction pressure, a compressor discharge pressure, a supply air temperature of air supplied by the CCU 152 into the climate controlled space 154, a return air temperature of air returned from the climate controlled space 154 back to the CCU 152, a humidity within the climate controlled space 154, etc.) and communicate parameter data to the climate controller 156. The climate controller 156 is configured to control operation of the transport climate control system 145 including components of the climate control circuit. The climate controller 156 may comprise a single integrated control unit 158 or may comprise a distributed network of climate controller elements 158, 159. The number of distributed controller elements in a given network can depend upon the particular application of the principles described herein.

FIG. 1D illustrates another embodiment of a climate controlled transport unit 160. The climate controlled transport unit 160 includes a multi-zone transport climate control system (MTCS) 162 for a transport unit 164 that can be towed, for example, by a tractor (not shown). It will be appreciated that the embodiments described herein are not limited to tractor and trailer units, but can apply to any type of transport unit (e.g., a truck, a container (such as a container on a flat car, an intermodal container, a marine container, etc.), a box car, a semi-tractor, a bus, or other similar transport unit), etc.

The MTCS 162 includes a CCU 166 and a plurality of remote units 168 that provide environmental control (e.g. temperature, humidity, air quality, etc.) within a climate controlled space 170 of the transport unit 164. The climate controlled space 170 can be divided into a plurality of zones 172. The term "zone" means a part of an area of the climate controlled space 170 separated by walls 174. The CCU 166 can operate as a host unit and provide climate control within a first zone 172a of the climate controlled space 170. The remote unit 168a can provide climate control within a second zone 172b of the climate controlled space 170. The remote unit 168b can provide climate control within a third zone 172c of the climate controlled space 170. Accordingly, the MTCS 162 can be used to separately and independently control environmental condition(s) within each of the multiple zones 172 of the climate controlled space 170.

The CCU 166 is disposed on a front wall 167 of the transport unit 164. In other embodiments, it will be appreciated that the CCU 166 can be disposed, for example, on a rooftop or another wall of the transport unit 164. The CCU 166 includes a climate control circuit (see FIG. 2) that connects, for example, a compressor, a condenser, an evaporator and an expansion device to provide conditioned air within the climate controlled space 170. The remote unit 168a is disposed on a ceiling 179 within the second zone 172b and the remote unit 168b is disposed on the ceiling 179 within the third zone 172c. Each of the remote units 168a,b include an evaporator (not shown) that connects to the rest of the climate control circuit provided in the CCU 166.

The MTCS 162 also includes a programmable climate controller 180 and one or more sensors (not shown) that are configured to measure one or more parameters of the MTCS 162 (e.g., an ambient temperature outside of the transport unit 164, an ambient humidity outside of the transport unit 164, a compressor suction pressure, a compressor discharge pressure, supply air temperatures of air supplied by the CCU 166 and the remote units 168 into each of the zones 172, return air temperatures of air returned from each of the zones 172 back to the respective CCU 166 or remote unit 168a or 168b, a humidity within each of the zones 172, etc.) and communicate parameter data to the climate controller 180. The climate controller 180 is configured to control operation of the MTCS 162 including components of the climate control circuit. The climate controller 180 may comprise a single integrated control unit 181 or may comprise a distributed network of climate controller elements 181, 182. The number of distributed controller elements in a given network can depend upon the particular application of the principles described herein.

Figure 1E:
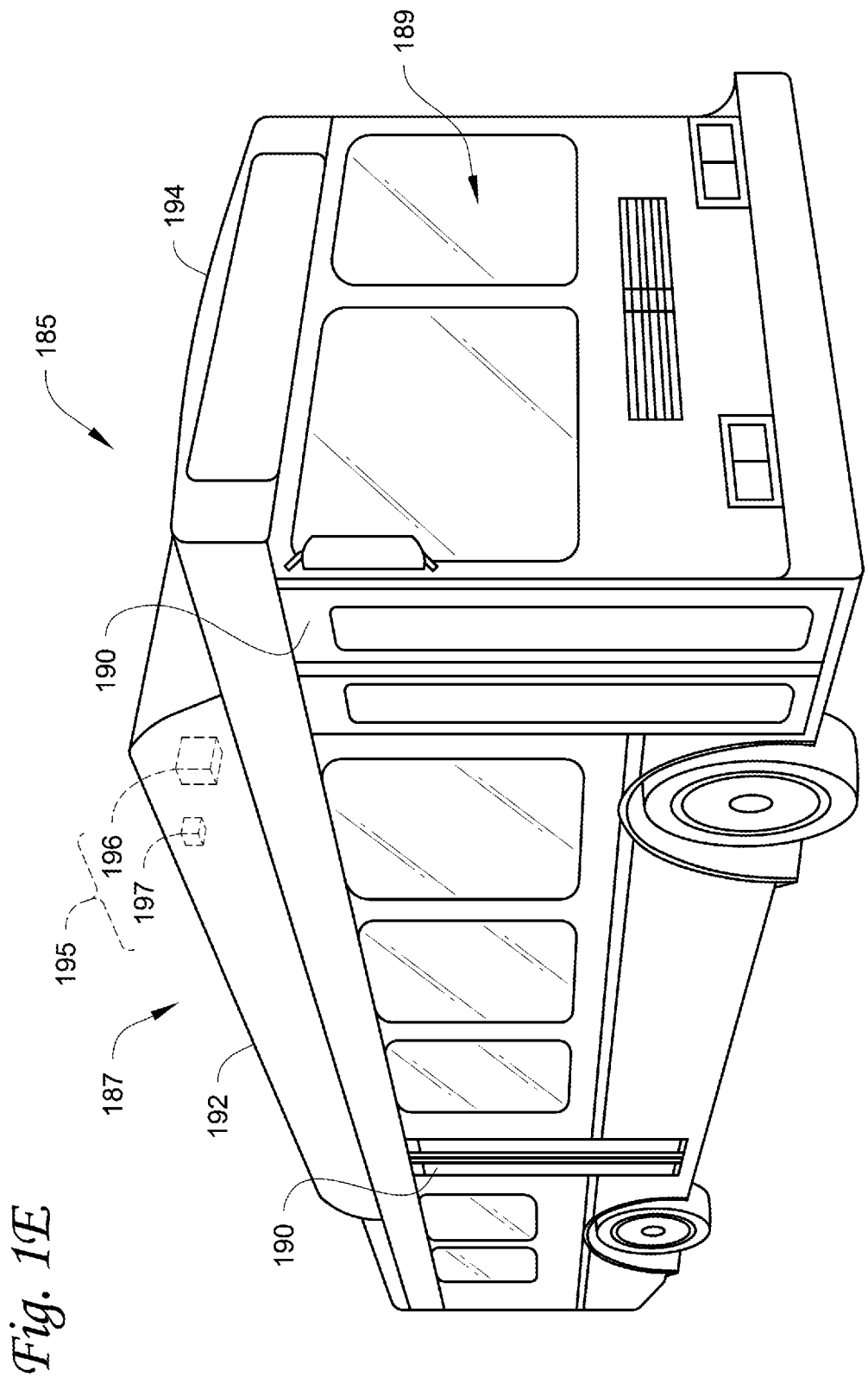
FIG. 1E illustrates a perspective view of a mass-transit vehicle including a transport climate control system, according to one embodiment.

FIG. 1E is a perspective view of a vehicle 185 including a transport climate control system 187, according to one embodiment. The vehicle 185 is a mass-transit bus that can carry passenger(s) (not shown) to one or more destinations. In other embodiments, the vehicle 185 can be a school bus, railway vehicle, subway car, or other commercial vehicle that carries passengers. The vehicle 185 includes a climate controlled space (e.g., passenger compartment) 189 that can accommodate a plurality of passengers. The vehicle 185 includes doors 190 that are positioned on a side of the vehicle 185. In the embodiment shown in FIG. 1E, a first door 190 is located adjacent to a forward end of the vehicle 185, and a second door 190 is positioned towards a rearward end of the vehicle 185. Each door 190 is movable between an open position and a closed position to selectively allow access to the climate controlled space 189. The transport climate control system 187 includes a CCU 192 attached to a roof 194 of the vehicle 185.

The CCU 192 includes a climate control circuit (see FIG. 2) that connects, for example, a compressor, a condenser, an evaporator and an expansion device to provide conditioned air within the climate controlled space 189. The transport climate control system 187 also includes a programmable climate controller 195 and one or more sensors (not shown) that are configured to measure one or more parameters of the transport climate control system 187 (e.g., an ambient temperature outside of the vehicle 185, a space temperature within the climate controlled space 189, an ambient humidity outside of the vehicle 185, a space humidity within the climate controlled space 189, etc.) and communicate parameter data to the climate controller 195. The climate controller 195 is configured to control operation of the transport climate control system 187 including components of the climate control circuit. The climate controller 195 may comprise a single integrated control unit 196 or may comprise a distributed network of climate controller elements 196, 197. The number of distributed controller elements in a given network can depend upon the particular application of the principles described herein.

Figure 2:
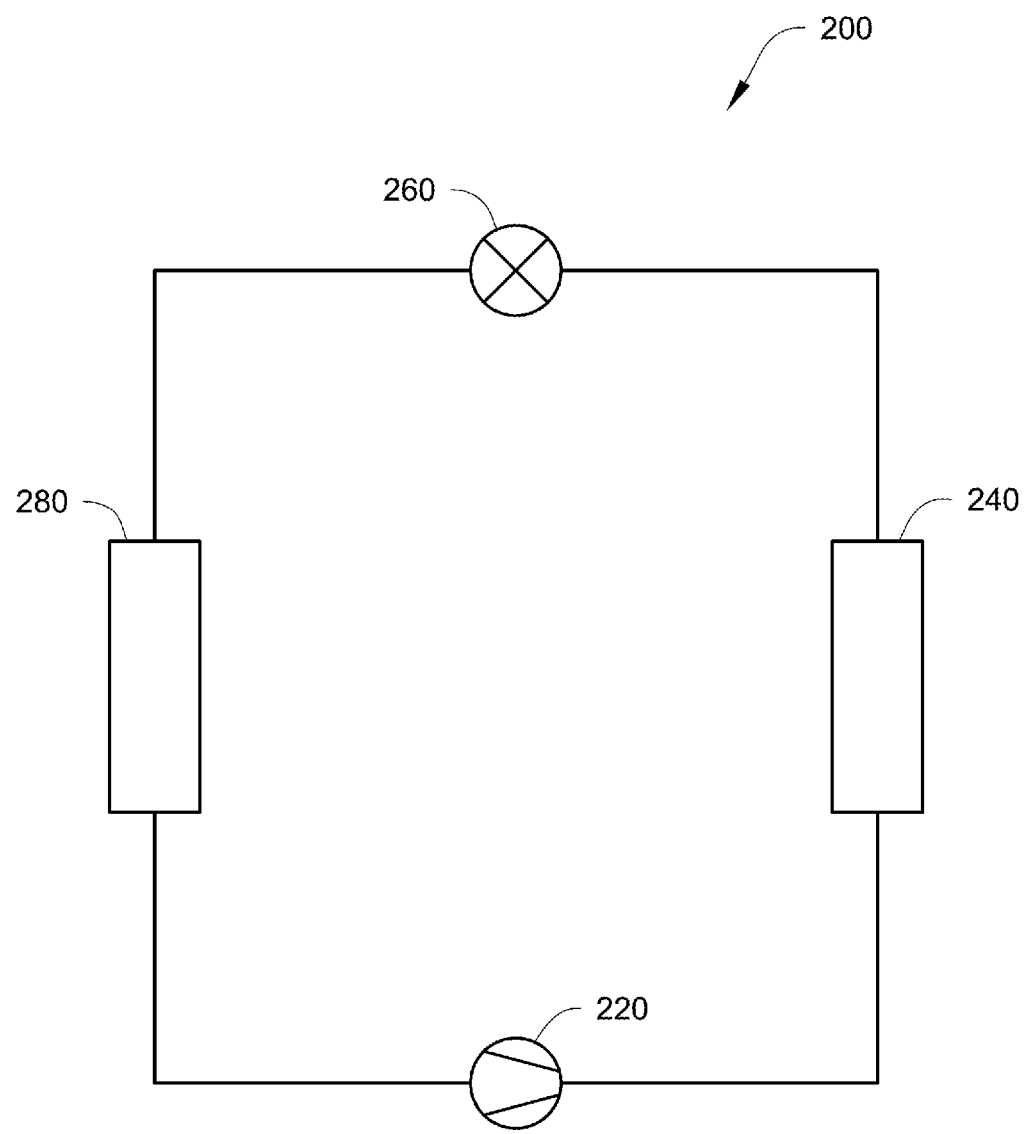
FIG. 2 is a schematic diagram of a climate control circuit, according to one embodiment.

FIG. 2 is a schematic diagram of a climate control circuit 200, according to one embodiment. The climate control circuit 200 can be used, for example, in a TCCS (e.g., the TCCS 110, 132, 145 and 187 and the MTCS 162 shown in FIGS. 1A-E).

The climate control circuit 200 generally includes a compressor 220, a condenser 240, an expansion device 260, and an evaporator 280. In one embodiment, the compressor 220 can be a variable speed compressor.

The climate control circuit 200 is an example and can be modified to include additional components. For example, in an embodiment, the climate control circuit 200 can include other components such as, but not limited to, an economizer heat exchanger, one or more flow control devices, a receiver tank, a dryer, a suction-liquid heat exchanger, one or more condenser fans (blowers), one or more evaporator fans (blowers), one or more sensors, a controller, or the like.

In one embodiment, the one or more condenser/evaporator fan(s) can be two-speed fan(s), fully variable speed fan(s) (i.e., having more than two speeds), low voltage DC fan(s), high voltage AC fan(s), etc. It will be appreciated that a two-speed fan refers to a fan with a high speed and a low speed (typically corresponding to a two-speed engine/generator that drives the fan). The one or more condenser/ evaporator fan(s) can be configured to run continuously and/or in a cycle-sentry mode.

As defined herein, "low voltage" refers to Class A of the ISO 6469-3 in the automotive environment. In particular, "low voltage" refers to a maximum working voltage of between 0V and 60V DC or between 0V and 30V AC. E.g., a low voltage can be 12VDC, 24VDC, 48VDC, or other suitable DC voltage.

As defined herein, "high voltage" refers to Class B of the ISO 6469-3 in the automotive environment. In particular, "high voltage" refers to a maximum working voltage of between 60V and 1500V DC or between 30V and 1000V AC. E.g., a high voltage can be 350VDC, 400VDC, 700VDC, 800VDC or other suitable DC voltage.

The climate control circuit 200 can generally be applied in a variety of systems used to control an environmental condition (e.g., temperature, humidity, air quality, or the like) in a space (generally referred to as a conditioned space). Examples of such systems include, but are not limited to, HVAC systems, transport refrigeration units, or the like. In one embodiment, an HVAC system can be a rooftop unit or a heat pump air-conditioning unit.

The compressor 220, condenser 240, expansion device 260, and evaporator 280 are fluidly connected. In one embodiment, the climate control circuit 200 can be configured to be a cooling system (e.g., an air conditioning system) capable of operating in a cooling mode. In one embodiment, the climate control circuit 200 can be configured to be a heat pump system that can operate in both a cooling mode and a heating/defrost mode.

The climate control circuit 200 can operate according to generally known principles. The climate control circuit 200 can be configured to heat or cool a liquid process fluid (e.g., a heat transfer fluid or medium (e.g., a liquid such as, but not limited to, water or the like)), in which case the climate control circuit 200 may be generally representative of a liquid chiller system. The climate control circuit 200 can alternatively be configured to heat or cool a gaseous process fluid (e.g., a heat transfer medium or fluid (e.g., a gas such as, but not limited to, air or the like)), in which case the climate control circuit 200 may be generally representative of an air conditioner or heat pump.

In operation, the compressor 220 compresses a working fluid (e.g., a heat transfer fluid (e.g., refrigerant or the like)) from a relatively lower pressure gas to a relatively higher-pressure gas. The relatively higher-pressure gas is also at a relatively higher temperature, which is discharged from the compressor 220 and flows through the condenser 240. In accordance with generally known principles, the working fluid flows through the condenser 240 and rejects heat to the process fluid (e.g., water, air, etc.), thereby cooling the working fluid. The cooled working fluid, which is now in a liquid form, flows to the expansion device 260. The expansion device 260 reduces the pressure of the working fluid. As a result, a portion of the working fluid is converted to a gaseous form. The working fluid, which is now in a mixed liquid and gaseous form flows to the evaporator 280. The working fluid flows through the evaporator 280 and absorbs heat from the process fluid (e.g., a heat transfer medium (e.g., water, air, etc.)), heating the working fluid, and converting it to a gaseous form. The gaseous working fluid then returns to the compressor 220. The above-described process continues while the heat transfer circuit is operating, for example, in a cooling mode.

Figure 3:
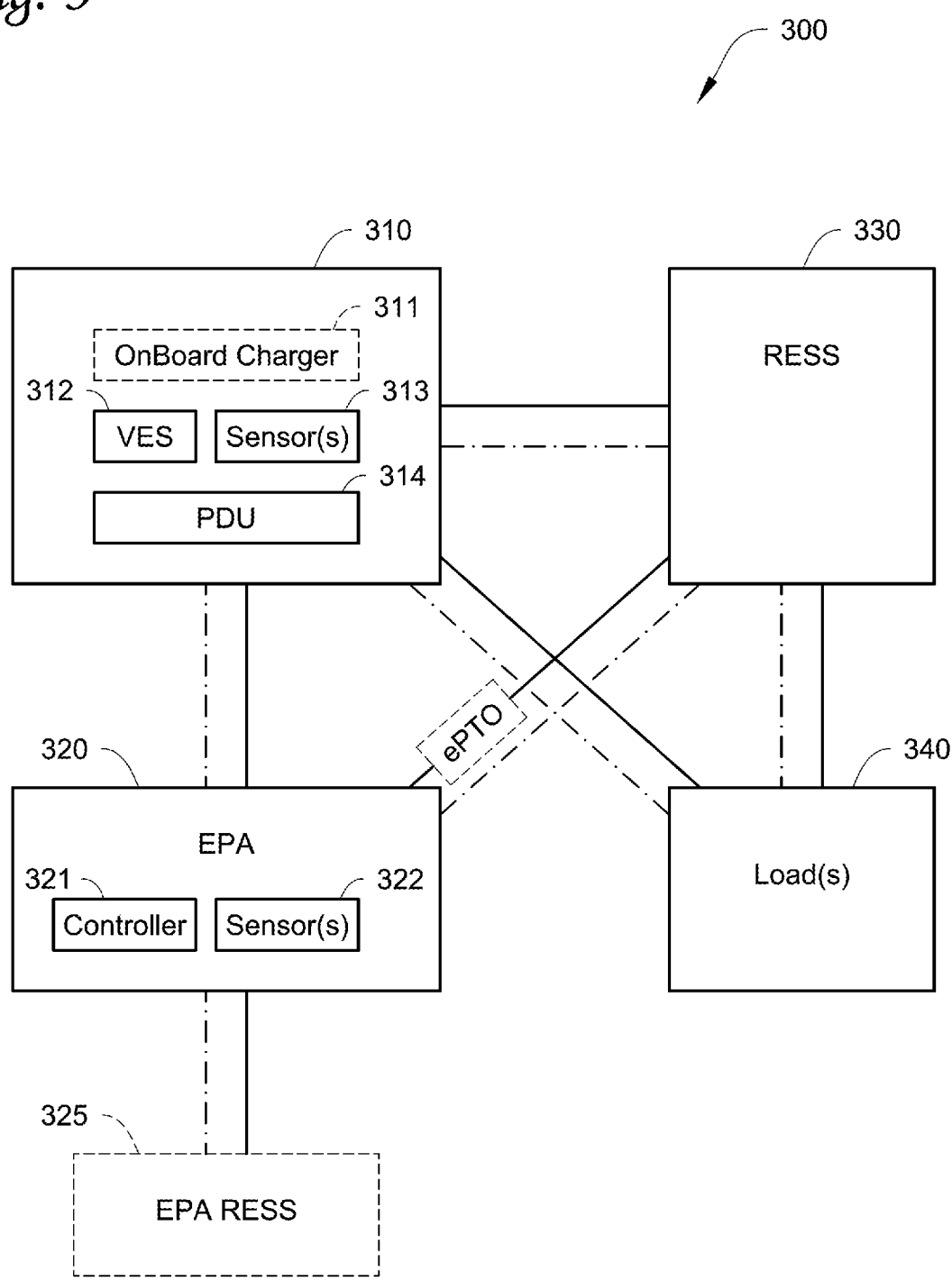
FIG. 3 is a schematic diagram of a system for adjusting power consumption of load(s), according to one embodiment.

FIG. 3 is a schematic diagram of a system 300 for adjusting power consumption of load(s) 320 and/or 340, according to one embodiment. The system 300 includes a vehicle 310, and an electrically powered accessory (EPA) 320 configured to be used with at least one of the vehicle 310, a trailer, and/or a transport container. The system 300 also includes a RESS 330, electrical load(s) 340, and optionally an EPA RESS 325.

The vehicle 310 includes an OnBoard Charger 311, a vehicle electrical system (VES) 312, sensor(s) 313, and a power distribution unit (PDU) 314. The vehicle 310 can be, for example, the climate-controlled van 100, the climate-controlled straight truck 130, the tractor 142 with a climate controlled transport unit 140 attached to, the climate controlled transport unit 160, and/or the vehicle 185 of FIGS. 1A-1E and/or a recreational vehicle (RV).

The VES 312 can provide electrical power to the electrical loads 340 of the vehicle, and/or to charge or discharge the energy storage (e.g., RESS 330) of the vehicle. The sensor(s) 313 can be inferential sensor(s) and/or C-Rate (and/or C-Rate changes) sensor(s). The PDU 314 can include a controller (not shown) configured to control the distribution of electric power to loads 340 of the vehicle 310.

Electrical loads 340 can include vehicle power train. Also the electrical loads 340 can include low voltage (LV) DC loads such as solenoids, fans, controllers, battery chargers, etc. Electrical loads 340 can also include high voltage (HV) DC loads such as fan motor, compressor motor, battery chargers, batteries, etc. Electrical loads 340 can further include HV AC loads such as fan motor, compressor motor, battery chargers, OnBoard charger, AC Power Module (ACPM), etc. ACPM can be a power converter used to take input of single-phase or three-phase AC power and create a DC power. Also Electrical loads 340 can include heater(s), display(s), telematics, and/or motors having power converters which can include DC/DC Converters and/or motor control inverters.

The EPA 320 can be, for example, the transport climate control system 110, 132, 145, 162, and/or 187 of FIGS. 1A-1E. The EPA 320 includes a controller 321. The controller 321 can be e.g., the controller 125, 135, 156, 180 and/or 195 shown in FIGS. 1A-E. The EPA 320 also includes sensor(s) 322. The sensor(s) 322 can be inferential sensor(s) and/or C-Rate (and/or C-Rate changes) sensor(s). The EPA 320 can include HV and/or LV loads including AC (single-phase and/or three-phase) and/or DC loads, e.g., heater(s), display(s), and/or telematics.

The EPA RESS 325 can provide power to operate the EPA 320. The RESS 330 can include a vehicle battery (or battery pack, e.g., a vehicle traction battery), a solar power source/storage, an auxiliary power source/storage, an electric APU auxiliary energy storage, a fuel cell power source/storage, an undermount power source/storage, a liftgate energy storage, etc. The RESS 330 can connect to and power the EPA 320 via, e.g., an ePTO. The vehicle 310 can communicate with the RESS 330 to enable/disable the ePTO feature.

FIG. 3 also shows power lines (solid lines) between/among the components and communication lines (dash-dot lines) between/among the components. It will be appreciated that the communication(s) between/among the components can be accomplished wirelessly or through wire connection(s), through any suitable communication media and/or using any suitable communication protocol(s). The power lines can be a part of a DC Bus of the system 300.

FIG. 4 is a flow chart illustrating a method 400 for adjusting power consumption of an electrically powered accessory (EPA) to reduce the C-Rate fluctuations in a system (see FIG. 3), according to one embodiment. In one embodiment, the system can include any one or more of the 100, 130, 140/142, 160, and 185 as shown in FIGS. 1A-1E.

While the embodiments described herein illustrate different embodiments of a transport climate control system, it will be appreciated that the electrically powered accessory (EPA) is not limited to the transport climate control system or a climate control unit (CCU, or a climate controlled transport unit (CCTU)) of the transport climate control system. It will be appreciated that a CCU/CCTU can be e.g., a transport refrigeration unit (TRU). In other embodiments, the EPA can be, for example, a crane attached to a vehicle, a cement mixer attached to a truck, one or more food appliances of a food truck, a boom arm attached to a vehicle, a concrete pumping truck, a refuse truck, a fire truck (with a power driven ladder, pumps, lights, etc.), etc. It will be appreciated that the EPA may require continuous operation even when the vehicle's ignition is turned off and/or the vehicle is parked and/or idling and/or charging. The EPA can require substantial power to operate and/or continuous and/or autonomous operation (e.g., controlling temperature/humidity/airflow of a climate controlled space) on an as needed basis, independent of the vehicle's operational mode.

The method 400 begins at 410 where the control flow starts. It will be appreciated that the control flow in method 400 can be performed by a controller (e.g., the controller 125, 135, 156, 180 and/or 195 shown in FIGS. 1A-E). The method 400 then proceeds to 420.

At 420, the EPA (e.g., a TCCS such as the TCCSs 110, 132, 145 and 187 and/or the MTCS 162 shown in FIGS. 1A-E)) is on and is operational (e.g., turned on or operated by the controller or by a user via the controller). For example, when a TCCS is on and operational, the TCCS can keep the cargo (e.g., produce, frozen foods, pharmaceuticals, etc.) safe and/or fresh. The cargo can be regulated by government bodies or of high economic value. The regulated cargo can include pharmaceuticals, meat, seafood, produce, dairy, and/or frozen foods, etc. Cargo having high economical value can include beverages, canned foods, paint, flowers, and/or plants, etc. The TCCS can prevent the cargo from being damaged by, e.g., maintaining the temperature of the cargo at or below a setpoint temperature.

It will be appreciated that different cargo can have different TCCS operational parameters. For example, pharmaceuticals can require a different operational mode (tight temperature control) which can be more power intensive/sensitive than other cargo. Produce such as berries can require constant airflow which can require additional power compared to cargo with discontinuous airflow. As such, the regulated cargo and/or cargo having economical value can be translated to different operational control: tight temperature control, lower setpoint temperature, continuous airflow, cycle sentry, and/or loose temperature control, etc., listed in a decreased order of power requirement.

The method 400 then proceeds to 430. At 430, the controller determines whether the C-Rate of the RESS is changing. The RESS can include a vehicle battery (or battery pack, e.g., a vehicle traction battery), a solar power source/storage, an auxiliary power source/storage, an electric APU auxiliary energy storage, a fuel cell power source/storage, an undermount power source/storage, a liftgate energy storage, etc. The RESS can connect to e.g., power sources such as electric vehicle supply equipment (EVSE), regenerative braking, utility (shore) power source, a generator onboard a vehicle, an electric power take-off (ePTO) connection, and solar power source, etc. The RESS can provide electrical power to the vehicle, the EPA, or other loads (e.g., vehicle power train).

The C-Rate of the RESS includes a C-Rate of electric power into the RESS (charge rate) and/or a C-Rate of electric power out of the RESS (discharge rate). In one embodiment, during charging of the RESS, the C-Rate of the RESS can change. For example, regenerative braking events of a vehicle can cause a large influx of current and instantaneous power.

It will be appreciated that regenerative braking is a power recovery mechanism that slows a vehicle or object by converting its kinetic energy into a form that can be either used immediately or stored until needed. In this mechanism, an electric motor can be used to use the vehicle's momentum to recover energy that would be otherwise lost to the brake discs as heat by e.g., friction in the brakes. It will be appreciated that in addition to improving the overall efficiency of the vehicle, regenerative braking can extend the life of the braking system as its parts do not wear as quickly.

In one embodiment, the large amount of power generated by e.g., the regenerative braking events of the vehicle for a very short period of time can cause the C-Rate into the RESS to fluctuate rapidly. It will be appreciated that high fluctuations in C-Rate can lead to reduced life of the RESS.

In one embodiment, when the RESS is fully charged or near fully charged, the power generated by e.g., the regenerative braking events or by vehicle mechanical breaking system may be wasted (e.g., immediately dissipated as heat in resistors).

The C-Rate (and/or C-Rate changes) can be determined by the controller via sensed data from, e.g., one or more sensors. The one or more sensors can include voltage sensor(s) and/or current sensor(s) to obtain e.g., the current into (or out of) the RESS, the voltage drop (or increase) on the DC bus (see FIG. 3), the power into and out of the RESS, etc. The one or more sensors can also include accelerometer sensor(s) or speed sensor(s) to obtain the speed and/or the rate of speed changes of the vehicle. The one or more sensors can further include temperature (e.g., ambient temperature, RESS temperature) sensor(s) and/or other RESS sensors (e.g., pressure, RESS charging status, RESS charging level, etc.) on the RESS and/or on other power electronics. Also the one or more sensors can include GPS for predictive vehicle engine load (e.g., uphill or downhill), revolutions per minute (RPM) sensor(s) of the vehicle for drive train (or torque sensor(s) for motor), pressure or electrical sensor(s) for pushing gas/brake pedal, etc. The sensed data obtained from the one or more sensors can be used to determine or predict the C-Rate (and/or C-Rate changes) of the RESS. It will be appreciated that the sensors(s) discussed above can be defined as inferential sensor(s) (i.e., sensor(s) that use other measurements to infer the quantity that is not measured directly), and the sensed data from these inferential sensor(s) can be used to determine or predict the C-Rate (and/or C-Rate changes) of the RESS. It will also be appreciated that the one or more sensors can include any other suitable inferential sensor(s). It will be appreciated that machine learning can be used to determine or predict the C-Rate (and/or C-Rate changes) or changes to the C-Rate (and/or C-Rate changes) of the RESS. It will be appreciated that the one or more sensors can also include sensor(s) that directly sense the C-Rate (and/or C-Rate changes) of the RESS. It will be appreciated that the one or more sensors can be disposed in the vehicle, in the EPA, or in both. If the controller determines that the C-Rate (and/or C-Rate changes) of the RESS is changing, the method 400 then proceeds to 440. If the controller determines that the C-Rate (and/or C-Rate changes) of the RESS is not changing (e.g., a constant value), the method 400 then proceeds back to 420. It will also be appreciated that at 430 the controller can send an explicit command/message to the variable load (e.g., the EPA) to shed load. In that embodiment, the method 400 then skips 440 and proceeds to 450.

At 440, the controller determines whether a load (e.g., a load of the EPA and/or the load(s) 340 as shown in FIG. 3) should be adjusted. In some embodiments, the C-Rate (and/or C-Rate changes) of the RESS is compared with a predetermined threshold value by, e.g., the controller. If the C-Rate (and/or C-Rate changes) does not exceed the predetermined threshold value (the EPA is not required to adjust its load), the method 400 then proceeds back to 420. If the C-Rate (and/or C-Rate changes) exceeds the predetermined threshold value (the EPA is required to adjust its load), the method 400 then proceeds to 450. It will be appreciated that in one embodiment, the predetermined threshold can be a value pre-stored in a memory of the EPA, a value from a lookup-table, and/or a value determined (e.g., by the controller) in a predetermined period of time (e.g., in less than a second) beforehand in comparison to a previous measurement.

For example, a large influx of power can be generated (e.g., from regenerative braking events). When the RESS is fully charged or near fully charged, the RESS cannot absorb or accept this additional energy, the method 400 then proceeds to 450. When the RESS is not fully charged nor near fully charged, and the RESS can absorb or accept this additional energy, the method 400 then proceeds back to 420. In another example, a large amount of power can be drawn from the RESS (e.g., for running/operating loads such as traction drives, air conditioning compressor, cabin heater, etc.). When the discharge rate (C-Rate out of the RESS) exceeds a predetermined threshold, the method 400 then proceeds to 450; otherwise, the method 400 then proceeds back to 420.

It will be appreciated that the electrical load of the EPA can be increased and/or decreased to minimize C-Rate (and/or C-Rate changes) on the RESS. For example, the EPA can serve as a variable load to the vehicle, to increase (or decrease) the EPA's power consumption through increased speed (or decreased speed) etc. to minimize the C-Rate (and/or C-Rate changes) of the RESS, to limit detrimental effects on RESS life (or maximize the RESS life), and increase efficiency by e.g., reducing the C-Rate fluctuations and/or overall C-Rate into and out of the RESS. In one embodiment, a vehicle can be viewed as a load on a power source. The power source can be a temporary power source such as a regenerative braking system (that generates regenerative braking event(s)). It will be appreciated that without the EPA as a variable load, the variable on-demand load on electrical vehicle may be the RESS (e.g., battery), and all of the power may be transferred there. It will also be appreciated that without the EPA as a variable load, some vehicle systems can have on-board resistor(s) that can turn excess power (e.g., power that the RESS is not able to safely accept when, e.g., the RESS is fully charged or near fully charged) into heat which is not efficient. In such case, when e.g., large C-Rate (and/or C-Rate changes) cannot exceed limits of the RESS, the resistor(s) can dissipate power as heat, which is not efficient usage of power.

In one embodiment, during discharging of the RESS, the C-Rate of the RESS can change. For example, running/operating loads (e.g., traction drives, air conditioning compressor, cabin heater, etc.) on the vehicle can increase the C-Rate out of the RESS. In this embodiment, the EPA can decrease its load to minimize power draw on the RESS to minimize the C-Rate (and/or C-Rate changes) on the RESS.

At 450, the controller is configured to request the load (a load of the EPA and/or the load(s) 340 as shown in FIG. 3) to adjust (increase and/or decrease) its electrical power consumption. It will be appreciated that if the controller is a controller of the EPA and/or the controller controls the EPA, 450 can be optional. The method 400 then proceeds to 460.

At 460, the controller is configured to determine whether the EPA is capable of adjusting its load (and/or whether the load(s) 340 as shown in FIG. 3 can be adjusted). In some embodiments, this includes the controller being configured to determine the present operational mode of the EPA. For example, when the EPA is a TCCS or a CCTU of a TCCS, there can be a set of operational modes such as tight temperature control, lower setpoint temperature, continuous airflow, start-stop, and/or loose temperature control, etc. The operational modes of the EPA can be determined based on e.g., the content of the cargo (e.g., produce, frozen foods, pharmaceuticals, etc.) that is stored as a parameter in a memory of the controller. The controller has algorithms to determine whether or not the EPA allows adjusting its load based on the determined operational mode.

In one embodiment, adjusting the load of the EPA can include increasing the load of the EPA and/or decreasing the load of the EPA. Increasing the load of the EPA can include increasing a speed of a compressor (e.g., a variable speed compressor) of the EPA, and/or increasing a speed of fan(s) (e.g., variable speed condenser fan(s) and/or variable speed evaporator fan(s)) of the EPA. Decreasing the load of the EPA can include decreasing the speed of the compressor of the EPA, and/or decreasing a speed of fan(s) of the EPA. It will be appreciated that other loads such as DC/DC Converter of the EPA can also be used to increase/decrease the load of the EPA. For example, the loads (such as heaters, displays, telematics, etc.) of the DC/DC Converter can be turned on and/or off by, e.g., the controller.

It will be appreciated that the determined operational mode may not allow for load adjustment of the EPA. For example, if the determined operational mode of the EPA requires tight temperature control (e.g., for regulated pharmaceuticals), the adjustment to the load of the EPA may not be allowed since it can be more temperature sensitive than other cargo. Some operational modes of the EPA may allow for increasing the load but not decreasing the load or vice versa. For example, produce such as berries can require constant airflow which can require additional power compared to cargo with discontinuous airflow. As such, increasing the load of the EPA may be allowed but decreasing the load of the EPA may not be allowed. Some operational modes of the EPA may allow for both increasing and decreasing the load. E.g., for frozen foods, some customers require deep-frozen temperature (e.g., at or around −20° F.) and some customers require frozen temperature (e.g., at or around 10° F.). Deep-frozen can be more power intensive than frozen. Typically there are tolerances (predetermined) to the setpoint of the control temperature, and the tolerances are enough to accommodate the request of adjustment (based on e.g., regenerative braking events and/or running/operating loads on the vehicle). For example, the compressor/fan(s) of the EPA can be configured to work harder (e.g., with increased speed) to achieve a lower than frozen/deep-frozen temperature. The compressor/fan(s) of the EPA can also be configured to work less hard (e.g., with decreased speed) but still properly maintain the temperature of the cargo within a tolerable range.

It will be appreciated that a set of predetermined parameters associated with the operational modes of the EPA can be used e.g., by the controller to determine whether the EPA allows adjusting its load based on the determined operational mode.

If the EPA allows for adjusting its load based on the determined operational mode, the method 400 then proceeds to 470. If the EPA does not allow for adjusting its load based on the determined operational mode, the method 400 then proceeds to 420 or optional 480.

At 470, the controller is configured to control the EPA to adjust (increase and/or decrease) its load (its electrical power consumption), or to adjust the load(s) 340 as shown in FIG. 3 to accommodate the request from 450. For example, a large influx of power can be generated from regenerative braking events (e.g., 10 seconds of the electrical/hybrid vehicle going downhill). Without the EPA as a variable load, when the RESS is fully charged or near fully charged, the RESS cannot absorb or accept this additional energy, resistance on board can transfer this additional power to heat and waste the power. With the EPA as a variable load, it is an opportunity for the variable load (EPA) to accept this additional power to put it to work. The EPA can convert this additional mechanical/electrical power and store the additional energy as thermal energy. For example, the controller can control the compressor of the EPA to speed up (or control the fan(s) of the EPA to speed up or to run continuously instead of cycle-sentry) to create more cold air. Typically, a 10-second regenerative braking event may not fluctuate the box temperature of the CCTU too much (e.g., increasing/decreasing the speed of the compressor/fan(s)/etc. for 10 seconds due to an e.g., regenerative braking event does not cause a large fluctuation in box temperature) and the additional power generated from the regenerative braking event can be saved (e.g., to lower the box temperature).

It will be appreciated that C-Rate can be directly proportional to current. Cycling the current through electronic components can cause thermal cycling due to the resistance of the components. Thermal cycling can typically cause components to wear out faster. As such, a steady C-Rate is desired. It will be appreciated that embodiments disclosed herein can improve RESS life and maintain more constant/stable/steady C-Rate (instead of e.g., big spikes followed by nothing). Embodiment disclosed herein can also keep desired/target operating point for the RESS (e.g., keep at or around 50%, 75%, or other percentage (the percentage is the unit for state of charge) of usage/setpoint) and adjust EPA operation to change instantaneous power consumption (e.g., short-term consumption of power) to desired/target setpoint operation (long-term optimized/efficient usage of power). As such, short-term C-Rate noise/fluctuation can be reduced. The method 400 then proceeds back to 420.

At optional 480, the EPA can communicate to the requestor (at 450) that EPA is unable to accommodate the load change request. For example, a controller of the EPA can generate an alarm message (e.g., notifying the requestor that the load change request cannot be accommodated) to the requestor at 450. It will be appreciated that if the requestor (at 450) is a controller of the EPA and/or controls the EPA, 480 would be optional. The method 400 then proceeds back to 420.

It will be appreciated that in a first embodiment, the vehicle includes a vehicle electrical system (VES) and a RESS. The vehicle also includes a controller (e.g., a VES controller or a power distribution unit (PDU) controller). In one embodiment, the controller described in the method 400 at 420-480 can be the controller of the vehicle. In such embodiment, the controller of the vehicle takes control of the vehicle as well as the EPA, and obtains sensed data from the sensors (e.g., to determine the C-Rate or C-Rate changes of the RESS). In such embodiment, both 450 and 480 can be optional since the controller of the vehicle has control over both the vehicle and the EPA.

In a second embodiment, the EPA can have a controller. The controller of the EPA can be, e.g., the programmable climate controller 125, 135, 156, 180, or 195 of FIGS. 1A-1E. In one embodiment, the controller described in method 400 at 420-480 can be the controller of the EPA. In such embodiment, the controller of the EPA takes control of the EPA and can directly monitor the RESS, and obtains sensed data from the sensors (e.g., to determine the C-Rate or C-Rate changes of the RESS). In such embodiment, both 450 and 480 can be optional since the controller of the EPA has control over both the vehicle and the EPA.

In a third embodiment, the system including both the vehicle and the EPA can have a controller. In one embodiment, the controller described in method 400 at 420-480 can be the controller of the system. In such embodiment, the controller of the system takes control of the vehicle as well as the EPA, and obtains sensed data from the sensors (e.g., to determine the C-Rate or C-Rate changes of the RESS). In such embodiment, both 450 and 480 can be optional since the controller of the system has control over both the vehicle and the EPA.

In a fourth embodiment, the vehicle includes a controller (e.g., a VES controller or a PDU controller). The EPA can have a controller. The controller of the EPA can be, e.g., the programmable climate controller 125, 135, 156, 180, or 195 of FIGS. 1A-1E.

In the fourth embodiment, when the RESS is the vehicle RESS (e.g., a vehicle traction battery), the controller described at 430 (to determine a change to C-Rate or to C-Rate changes), 440 (to determine whether the change to C-Rate or to C-Rate changes exceeds a predetermined limit), and 450 (to communicate to and request the EPA to adjust its load) can be the controller of the vehicle. The vehicle RESS can connect to and power the EPA via, e.g., ePTO. It will be appreciated that an ePTO can be defined as e.g., taking electrical power from a power source and transmitting the electrical power to an application such as an attached implement or separate machines, via electric mechanisms. The controller described at 420 (to turn on and operate the EPA), 460 (to determine the EPA operational mode and determine whether the EPA can adjust load), 470 (to control the EPA to adjust the load), and optional 480 (to communicate with the requestor that the load change request cannot be accommodated) can be the EPA controller.

In the fourth embodiment, when the RESS is the EPA RESS (e.g., an auxiliary battery) or other RESS, the controller described at 430 (to determine a change to C-Rate or to C-Rate changes), 440 (to determine whether the change to C-Rate or to C-Rate changes exceeds a predetermined limit), and 450 (to communicate to and request the EPA to adjust its load) can be the controller of the EPA RESS (e.g., a battery management system (BMS) controller) or can be the controller of the EPA. The controller described at 420 (to turn on and operate the EPA), 460 (to determine the EPA operational mode and determine whether the EPA can adjust load), 470 (to control the EPA to adjust the load), and optional 480 (to communicate with the requestor that the load change request cannot be accommodated) can be the EPA controller.

In the fourth embodiment, when the controller described at 430, 440, and 450 is the vehicle controller (or the BMS controller), the communication (e.g., at 450 and/or 480, and/or between 420 and 430) between the vehicle controller (or the BMS controller) and the EPA controller can be conducted via e.g., powerline communications, Pulse Width Modulation (PWM) communications, Local Interconnect Network (LIN) communications, Controller Area Network (CAN) communications, Local Area Network (LAN) communications, Wide Area Network (WAN) communications, Internet communications, Pilot signal analog feedback, serial bus communication, Ethernet communication, short-range wireless communications such as WiFi and/or Bluetooth, and/or any other suitable communications. The communication between the vehicle controller (or the BMS controller) and the EPA controller can utilize any suitable communications including wired and/or wireless, analog and/or digital communications. In one embodiment, the communication between the vehicle controller (or the BMS controller) and the EPA controller can include communications over telematics and/or over cloud. In one embodiment, the communication between the vehicle controller (or the BMS controller) and the EPA controller can be explicit command/message(s), broadcast message(s), implicit message (e.g., from checking the status of the vehicle/RESS/EPA, etc.), etc. For example, when there is an increase or decrease in current into/out of the RESS, there can be a communication (e.g., a request) to the EPA to increase or decrease its electrical load. The EPA can take this request and if the EPA is in a mode that allows the adjustment, the EPA can respond accordingly.

It will be appreciated that the EPA needs to be on and in an operational mode to allow the adjustment of the EPA load (if the operational mode allows an adjustment). The EPA can decrease load or de-rate during e.g., a vehicle start from a dead stop, and consume more power during e.g., a regenerative braking event. Embodiments disclosed herein can operate the system more efficiently, and utilize available power while also properly maintaining the function of the EPA (e.g., maintain the temperature of the cargo). Embodiments disclosed herein can provide more predictable loads, and minimize fluctuations in RESS charge/discharge rates and minimize the maximum instantaneous power the RESS needs to provide the system.

ASPECTS

It is to be appreciated that any of aspects 1-10 can be combined with any of aspects 11-14 and 15-16, and any of aspects 11-14 can be combined with any of aspects 15-16.

Aspect 1. A method of minimizing C-Rate fluctuations with a climate controlled transport unit (CCTU), the method comprising:
 determining a first C-Rate of a Rechargeable Energy Storage System (RESS);
 comparing the first C-Rate to a first predetermined threshold;
 when the first C-Rate exceeds the first predetermined threshold, a controller of the CCTU determining a first operational mode of the CCTU;
 the controller adjusting the load of the CCTU based on the first operational mode.

Aspect 2. The method according to aspect 1, further comprising:
 changing an operational mode of the RESS between a charging mode and a discharging mode;
 determining a second C-Rate of the RESS;
 comparing the second C-Rate to a second predetermined threshold;
 when the second C-Rate exceeds the second predetermined threshold, the controller determining a second operational mode of the CCTU;
 the controller adjusting the load of the CCTU based on the second operational mode.

Aspect 3. The method according to aspect 1 or aspect 2, wherein the first C-Rate of the RESS is a C-Rate for current into the RESS, and
 wherein adjusting the load of the CCTU based on the first operational mode includes increasing the load of the CCTU.

Aspect 4. The method according to aspect 3, wherein increasing the load of the CCTU includes increasing a speed of a compressor of the CCTU and/or increasing a speed of a fan of the CCTU.

Aspect 5. The method according to aspect 3, wherein increasing the load of the CCTU includes turning on loads of the CCTU, the loads include at least one of a heater, a display, and/or a telematics.

Aspect 6. The method according to any one of aspects 2-5, wherein the second C-Rate of the RESS is a C-Rate for current out of the RESS, and
 wherein adjusting the load of the CCTU based on the second operational mode includes decreasing the load of the CCTU.

Aspect 7. The method according to aspect 6, wherein decreasing the load of the CCTU includes decreasing a speed of a compressor of the CCTU and/or decreasing a speed of a fan of the CCTU.

Aspect 8. The method according to aspect 6, wherein decreasing the load of the CCTU includes turning off loads of the CCTU, the loads include at least one of a heater, a display, and/or a telematics.

Aspect 9. The method according to any one of aspects 1-8, further comprising:
 determining whether the first operational mode of the CCTU allows for a load change; and
 the controller generating an alarm message when the first operational mode does not allow for the load change.

Aspect 10. The method according to any one of aspects 1-9, wherein the first C-Rate is impacted by a regenerative braking event.

Aspect 11. A method of minimizing C-Rate fluctuations with a vehicle, the method comprising:
 determining, by a controller of the vehicle, a first C-Rate of a Rechargeable Energy Storage System (RESS); and
 comparing the first C-Rate to a first predetermined threshold;
 when the first C-Rate exceeds the first predetermined threshold, the controller sending a first request to an electrically powered accessory (EPA) to adjust a load of the EPA.

Aspect 12. The method according to aspect 11, further comprising:
 the controller receiving a first feedback from the EPA based on the first request.

Aspect 13. The method according to aspect 11 or aspect 12, further comprising:
 changing an operational mode of the RESS between a charging mode and a discharging mode;
 determining, by the controller of the vehicle, a second C-Rate of the RESS;
 comparing the second C-Rate to a second predetermined threshold; and
 when the second C-Rate exceeds the second predetermined threshold, the controller sending a second request to the EPA to adjust the load of the EPA.

Aspect 14. The method according to aspect 13, further comprising:
the controller receiving a second feedback from the EPA based on the second request.

Aspect 15. A method of minimizing C-Rate fluctuations with an electrically powered accessory (EPA) that is configured to be used with at least one of a vehicle, a trailer, and a transport container that has a first controller, the EPA having a second controller, the method comprising:
determining, by the first controller, a first C-Rate of a Rechargeable Energy Storage System (RESS);
comparing the first C-Rate to a first predetermined threshold;
when the first C-Rate exceeds the first predetermined threshold, the first controller sending a first request to the second controller to adjust a load of the EPA;
the second controller determining a first operational mode of the EPA based on the first request;
the second controller adjusting the load of the EPA based on the first operational mode.

Aspect 16. The method according to aspect 15, further comprising:
changing an operational mode of the RESS between a charging mode and a discharging mode;
determining, by the first controller, a second C-Rate of the RESS;
comparing the second C-Rate to the second predetermined threshold;
when the second C-Rate exceeds the second predetermined threshold, the first controller sending a second request to the second controller to adjust the load of the EPA;
the second controller determining a second operational mode of the EPA based on the second request;
the second controller adjusting the load of the EPA based on the second operational mode.

The terminology used in this specification is intended to describe particular embodiments and is not intended to be limiting. The terms "a," "an," and "the" include the plural forms as well, unless clearly indicated otherwise. The terms "comprises" and/or "comprising," when used in this specification, specify the presence of the stated features, integers, steps, operations, elements, and/or components, but do not preclude the presence or addition of one or more other features, integers, steps, operations, elements, and/or components.

With regard to the preceding description, it is to be understood that changes may be made in detail, especially in matters of the construction materials employed and the shape, size, and arrangement of parts without departing from the scope of the present disclosure. This specification and the embodiments described are exemplary only, with the true scope and spirit of the disclosure being indicated by the claims that follow.

What is claimed is:

1. A method of minimizing C-Rate fluctuations with a climate controlled transport unit (CCTU), the method comprising:
determining a first C-Rate of a Rechargeable Energy Storage System (RESS);
comparing the first C-Rate to a first predetermined threshold;
when the first C-Rate exceeds the first predetermined threshold, a controller of the CCTU determining a first operational mode of the CCTU;
the controller adjusting the load of the CCTU based on the first operational mode,
wherein the first C-Rate of the RESS is a C-Rate for current into the RESS, and
wherein adjusting the load of the CCTU based on the first operational mode includes increasing the load of the CCTU to reduce the C-Rate for current into the RESS.

2. The method according to claim 1, further comprising:
changing an operational mode of the RESS between a charging mode and a discharging mode;
determining a second C-Rate of the RESS;
comparing the second C-Rate to a second predetermined threshold;
when the second C-Rate exceeds the second predetermined threshold, the controller determining a second operational mode of the CCTU;
the controller adjusting the load of the CCTU based on the second operational mode.

3. The method according to claim 1, wherein increasing the load of the CCTU includes increasing a speed of a compressor of the CCTU.

4. The method according to claim 1, wherein increasing the load of the CCTU includes increasing a speed of a fan of the CCTU.

5. The method according to claim 2, wherein the second C-Rate of the RESS is a C-Rate for current out of the RESS, and
wherein adjusting the load of the CCTU based on the second operational mode includes decreasing the load of the CCTU.

6. The method according to claim 5, wherein decreasing the load of the CCTU includes decreasing a speed of a compressor of the CCTU.

7. The method according to claim 5, wherein decreasing the load of the CCTU includes decreasing a speed of a fan of the CCTU.

8. The method according to claim 1, further comprising:
determining whether the first operational mode of the CCTU allows for a load change; and
the controller generating an alarm message when the first operational mode does not allow for the load change.

9. The method according to claim 1, wherein the first C-Rate is impacted by a regenerative braking event.

10. A method of minimizing C-Rate fluctuations with a climate controlled transport unit (CCTU), the method comprising:
determining a first C-Rate of a Rechargeable Energy Storage System (RESS);
comparing the first C-Rate to a first predetermined threshold;
when the first C-Rate exceeds the first predetermined threshold, a controller of the CCTU determining a first operational mode of the CCTU;
the controller adjusting the load of the CCTU based on the first operational mode,
wherein the first C-Rate of the RESS is a C-Rate for current out of the RESS, and
wherein adjusting the load of the CCTU based on the first operational mode includes decreasing the load of the CCTU to reduce the C-Rate for current out of the RESS.

11. The method according to claim 10, wherein decreasing the load of the CCTU includes decreasing a speed of a compressor of the CCTU.

12. The method according to claim 10, wherein decreasing the load of the CCTU includes decreasing a speed of a fan of the CCTU.

13. The method according to claim 10, further comprising:
  determining whether the first operational mode of the CCTU allows for a load change; and
  the controller generating an alarm message when the first operational mode does not allow for the load change.

14. The method according to claim 10, further comprising:
  changing an operational mode of the RESS;
  determining a second C-Rate of the RESS;
  comparing the second C-Rate to a second predetermined threshold;
  when the second C-Rate exceeds the second predetermined threshold, the controller determining a second operational mode of the CCTU;
  the controller adjusting the load of the CCTU based on the second operational mode.

15. The method according to claim 14, wherein the second C-Rate of the RESS is a C-Rate for current into the RESS, and
  wherein adjusting the load of the CCTU based on the second operational mode includes increasing the load of the CCTU to reduce the C-Rate for current into the RESS.

16. The method according to claim 15, wherein increasing the load of the CCTU includes increasing a speed of a compressor of the CCTU.

17. The method according to claim 15, wherein increasing the load of the CCTU includes increasing a speed of a fan of the CCTU.

18. The method according to claim 14, wherein the second C-Rate is impacted by a regenerative braking event.

19. A method of minimizing C-Rate fluctuations with a climate controlled transport unit (CCTU), the method comprising:
  determining a first C-Rate of a Rechargeable Energy Storage System (RESS);
  comparing the first C-Rate to a first predetermined threshold;
  when the first C-Rate exceeds the first predetermined threshold, a controller of the CCTU determining a first operational mode of the CCTU;
  the controller adjusting the load of the CCTU based on the first operational mode;
  changing an operational mode of the RESS between a charging mode and a discharging mode;
  determining a second C-Rate of the RESS;
  comparing the second C-Rate to a second predetermined threshold;
  when the second C-Rate exceeds the second predetermined threshold, the controller determining a second operational mode of the CCTU;
  the controller adjusting the load of the CCTU based on the second operational mode;
  wherein the second C-Rate of the RESS is a C-Rate for current out of the RESS, and
  wherein adjusting the load of the CCTU based on the second operational mode includes decreasing the load of the CCTU.

20. The method according to claim 19, wherein decreasing the load of the CCTU includes decreasing a speed of a compressor of the CCTU or decreasing a speed of a fan of the CCTU.

* * * * *